United States Patent
Hsieh (10) Patent No.: US 8,648,337 B2
(45) Date of Patent: Feb. 11, 2014

(54) ACTIVE MATRIX ORGANIC LIGHT-EMITTING DIODE

(75) Inventor: Hsing-Hung Hsieh, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 0 days.

(21) Appl. No.: 13/438,071

(22) Filed: Apr. 3, 2012

(65) Prior Publication Data

US 2013/0256703 A1     Oct. 3, 2013

(51) Int. Cl.
*H01J 9/00*     (2006.01)

(52) U.S. Cl.
USPC .............................................. 257/40; 257/59

(58) Field of Classification Search
USPC ................. 257/57, 59, 66, 72, 359, 390, 443, 257/E21.411, E21.412, E51.005, E29.151, 257/E27.117, 83, E27; 313/504, 506, 498, 313/500, 509, 512; 428/690, 917
See application file for complete search history.

(56) References Cited

U.S. PATENT DOCUMENTS

| | | | |
|---|---|---|---|
| 2007/0065962 A1* | 3/2007 | Pichler | 438/47 |
| 2008/0284327 A1* | 11/2008 | Kang et al. | 313/504 |
| 2010/0001633 A1* | 1/2010 | Lee et al. | 313/504 |
| 2010/0327263 A1* | 12/2010 | Lin et al. | 257/40 |
| 2011/0003414 A1* | 1/2011 | Choi | 438/29 |

* cited by examiner

*Primary Examiner* — Steven Loke
*Assistant Examiner* — Mouloucoulaye Inoussa (57) ABSTRACT

A stratified organic light-emitting diode structure includes a thin-film transistor and an organic light-emitting diode (OLED). The OLED is fabricated on a planarization layer that has a top surface substantially parallel to the substrate, and the layers in the organic light-emitting diode (OLED) are substantially parallel to each other. The major part of each OLED layer has a uniform thickness so that the OLED produces a uniform brightness. The planarization layer covers the thin-film transistor entirely and the planarization layer on top of the thin-film transistor is also covered by an insulation layer. In order to electrically connect the top electrode of the OLED to the drain terminal of the thin-film transistor, an opening is made through both the top insulating layer and the planarization layer to expose part of the drain terminal. Spacers with uniform height are fabricated on the top insulating layer to protect the pixel structure.

19 Claims, 12 Drawing Sheets

ACTIVE MATRIX ORGANIC LIGHT-EMITTING DIODE

FIELD OF THE INVENTION

The present invention relates generally to an active-matrix organic light-emitting diode (AMOLED) and, more specifically, an AMOLED with an n-type TFT to be used in a display panel.

BACKGROUND OF THE INVENTION

Figure 1A:
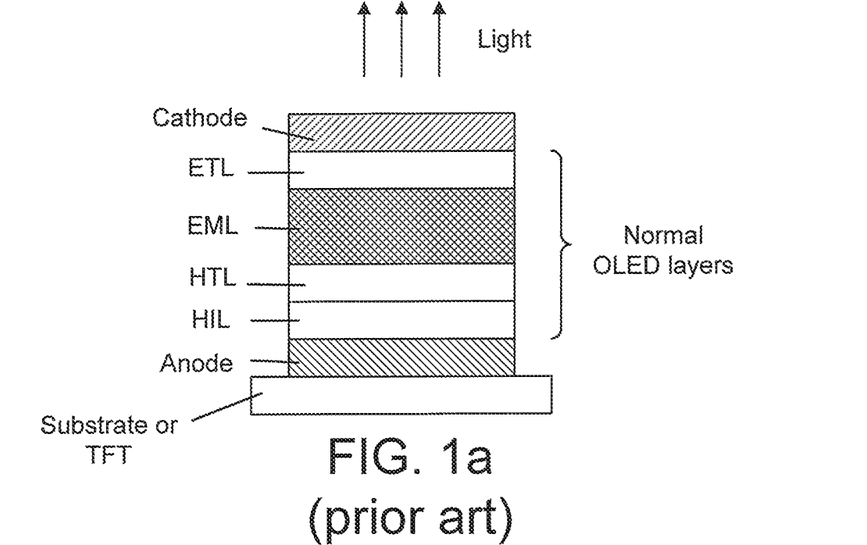
FIG. 1a shows a normal organic light-emitting diode.
Figure 1B:
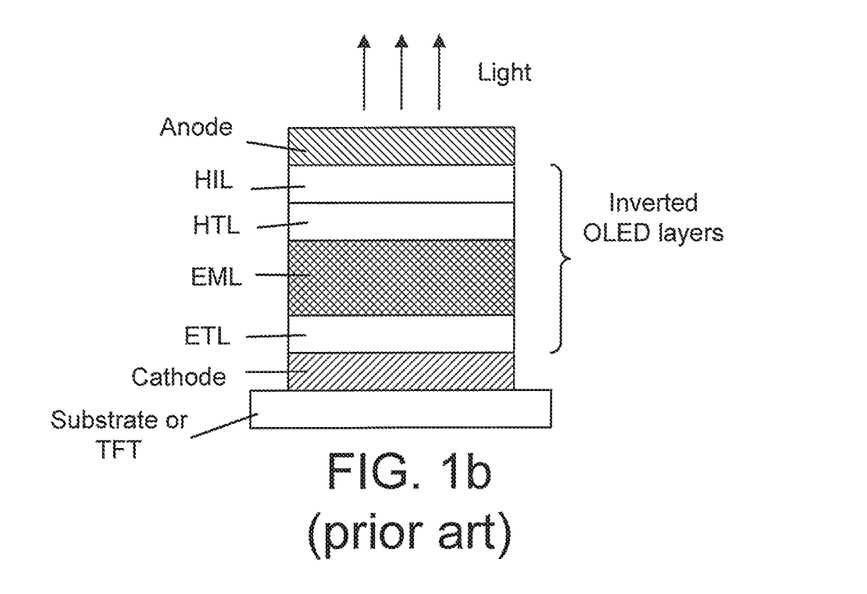
FIG. 1b shows an inverted organic light-emitting diode.
Figure 2A:
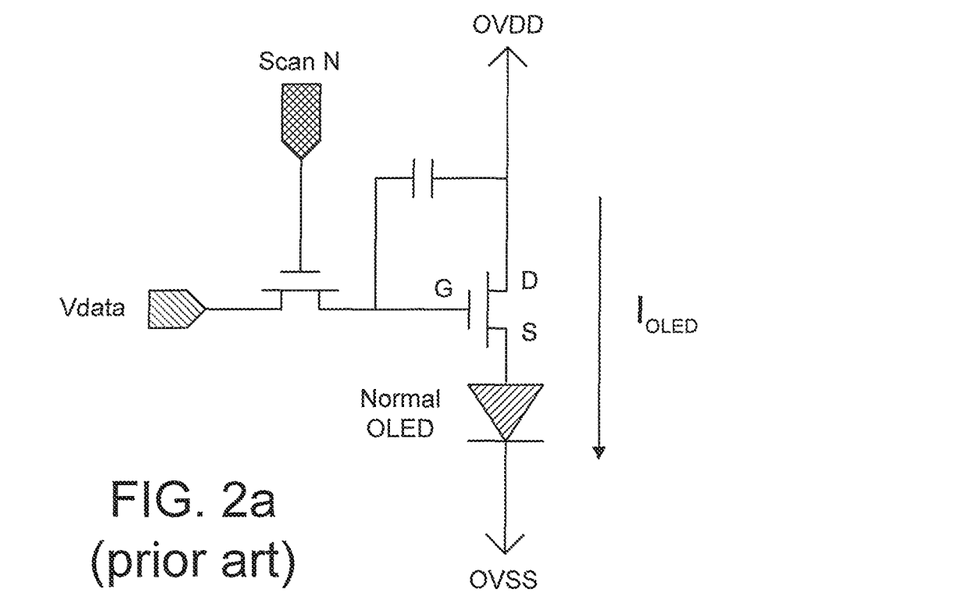
Figure 2B:
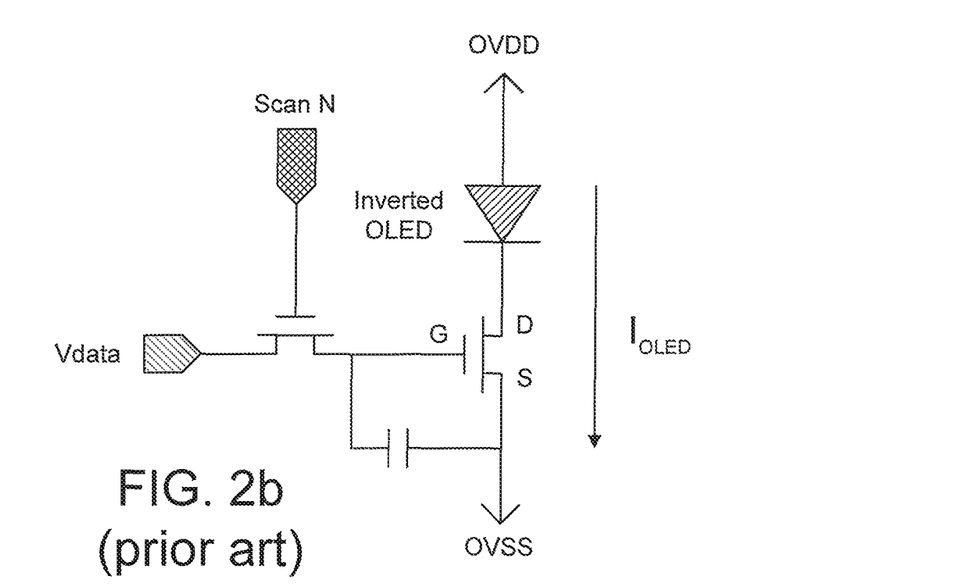
FIG. 2b shows a typical circuit in a pixel having an inverted organic light-emitting diode of FIG. 1b.

AMOLED (active-matrix organic light-emitting diode) is a display technology for use in mobile devices, televisions and other display panels. Active matrix refers to the technology behind the addressing of pixels. As known in the art, an organic light-emitting diode typically comprises a cathode layer, an electron transport layer (ETL), an emissive layer (EML), a hole transport layer (HTL), a hole injection layer (HIL) and an anode layer. As shown in FIG. 1a, the organic light-emitting diode may be fabricated on a substrate or over a thin-film transistor (TFT). The layer structure comprising the ETL, EML, HTL and HIL is also referred to as an organic active layer. A pixel circuit of a pixel having an OLED fabricated over a TFT is shown in FIG. 2a. An image display using the pixel circuit as shown in FIG. 2a generally has a defect known as image sticking. The organic light-emitting diode can also be fabricated in an inverted fashion wherein the cathode is the first layer disposed on the substrate as shown in FIG. 1b. A pixel circuit of a pixel having an inverted OLED fabricated over a TFT is shown in FIG. 2b. In a pixel circuit comprising an inverted OLED, the organic active layer has a layer structure of HIL, HTL, EML and ETL. In fabricating the inverted OLED as shown in FIG. 1b, there are a number of technical challenges and difficulties. It is because the cathode layer is subject to oxidation and the anode sputtering process can seriously damage the underlying organic active layer. Furthermore, the operational voltage of the inverted OLED as shown in FIG. 1b is relatively high as compared to the OLED as shown in FIG. 1a. A high operational voltage could reduce the useful life of an OLED.

Figure 3:
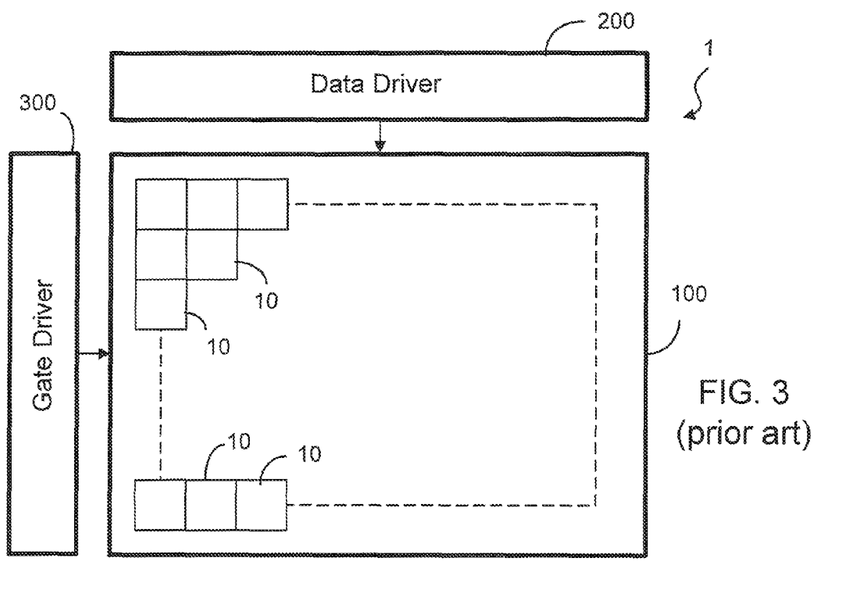
FIG. 3 illustrates a typical display panel having a display area using organic light-emitting diodes in pixels.
Figure 4:
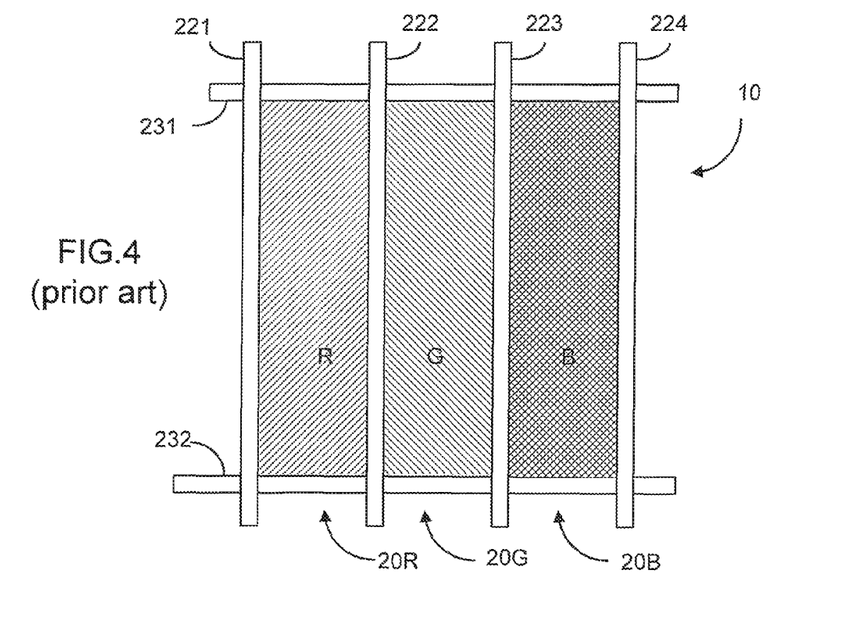
FIG. 4 illustrates a pixel having three color sub-pixels.

Normal OLEDs and inverted OLEDs have been used in a display panel. A typical display panel is shown in FIG. 3. As shown in FIG. 3, the display panel 1 has a display area 100 has an array of pixels 10. The display area is configured to receive data signals from a data driver 200 and gate-line signals from a gate driver 300. Each of the pixels 10 may have a plurality of color sub-pixels. As shown in FIG. 4, the pixel 10 has three color sub-pixels 20R, 20G and 20B separately receiving data signals from data lines 221, 222, 223 and a gate-line signal from gate-line 231. The data-line 224 is for the pixels in the next column and the gate-line 232 is for the pixels in the next raw. As known in the art, each of the color sub-pixels comprises a pixel circuit as shown in FIG. 2a or FIG. 2b.

SUMMARY OF THE INVENTION

The first aspect of the present invention is a method of fabricating an organic light-emitting diode structure on a substrate, wherein the substrate has a switching structure comprising a thin-film transistor having a source terminal, a gate terminal and a drain terminal.
The method comprises the following steps:
disposing a first insulating layer on the switching structure, the first insulating layer entirely covering the thin-film transistor;
disposing a first electrode layer on one part of the first insulating layer;
disposing a second insulating layer on the first electrode layer and a different part of the first insulating layer;
providing a first opening through the second insulating layer for providing an exposed part of the first electrode layer and a second opening through the first insulating layer and the second insulating layer for providing an exposed part of the drain terminal;
disposing an organic active layer over the exposed part of the first electrode layer through the first opening; and
disposing a second electrode layer over the second insulating layer and the organic active layer such that one part of the second electrode layer is in electrical contact with the organic active layer to form a light-emitting diode together with the first electrode layer, and that a different part of the second electrode layer is in contact with the exposed part of the drain terminal through the second opening.

According to various embodiments of the present invention, the switching structure comprises:
a first metal layer disposed on part of the substrate for forming the gate terminal;
a third insulating layer disposed on the substrate and the first metal layer, the third insulating layer entirely covering the first metal layer;
a semiconductor layer disposed over one part of the third insulating layer above the first metal layer for forming a channel layer;
a second metal layer disposed over a different part of the third insulating layer for separately forming the drain terminal and the source terminal above the first metal layer, the drain terminal and the source terminal separately in electrical contract with the channel layer, and a protective layer between part of the drain terminal and the channel layer and between part of the source terminal and the channel layer.

According to one embodiment of the present invention, the first insulating layer has a first surface adjacent to the first electrode layer and spaced from the substrate, the first surface substantially parallel to the substrate.

According to various embodiments of the present invention, the organic active layer comprises:
an electron transport layer adjacent to the second electrode layer, a hole transport layer adjacent to the first electrode layer and an emissive layer between the electron transport layer, the hole transport layer, and a hole injection layer between the hole transport layer and the first electrode layer.

According to various embodiments of the present invention, the method further comprises disposing one or more spacers over the organic light-emitting diode structure.

According to one embodiment of the present invention, the switching structure comprises:
a semiconductor layer disposed on part of the substrate for forming a channel layer;
a third insulating layer disposed on the substrate and the semiconductor layer, the third insulating layer entirely covering the semiconductor layer;
a first metal layer disposed on one part of the third insulating layer for forming the gate terminal above the channel layer;
a fourth insulating layer disposed over the first metal layer and another part of the third insulating layer, wherein a first opening made through the fourth insulating layer and the third insulating layer for providing a first exposed part of the channel layer, and that a second opening made through the fourth insulating layer and the third insulating layer for providing a second exposed part of the channel layer; and a second metal layer disposed on a first part of the fourth insulating layer for forming the drain terminal and a second part of the fourth insulating layer for forming the source terminal, the drain terminal in electrical contact with the first exposed part of the channel layer through the first opening, and the source terminal in electrical contact with the second exposed part of the channel layer through the second opening.

The second aspect of the present invention is an organic light-emitting diode structure, which comprises:

a switching structure on a substrate, the switching structure comprising a thin-film transistor comprising a source terminal, a gate terminal and a drain terminal;

a first insulating layer disposed on the switching structure, the first insulating layer entirely covering the thin-film transistor;

a first electrode layer disposed on one part of the first insulating layer; a second insulating layer disposed on the first electrode layer and a different part of the first insulating layer, wherein a first opening made through the second insulating layer for providing an exposed part of the first electrode layer, and that a second opening made through the first insulating layer and the second insulating layer for providing an exposed part of the drain terminal;

an organic active layer disposed over the exposed part of the first electrode layer through the first opening; and a second electrode layer disposed over the second insulating layer and the organic active layer such that one part of the second electrode layer is in electrical contact with the organic active layer, and that a different part of the second electrode layer is in contact with the exposed part of the drain terminal through the second opening.

According to various embodiments of the present invention, the switching structure comprises:

a first metal layer disposed on part of the substrate for forming the gate terminal;

a third insulating layer disposed on the substrate and the first metal layer, the third insulating layer entirely covering the first metal layer;

a semiconductor layer disposed over one part of the third insulating layer above the first metal layer for forming a channel layer;

a second metal layer disposed over a different part of the third insulating layer for separately forming the drain terminal and the source terminal above the first metal layer, the drain terminal and the source terminal separately in electrical contact with the channel layer; and a protective layer between part of the drain terminal and the channel layer and between part of the source terminal and the channel layer.

According to various embodiments of the present invention, the first insulating layer having a first surface adjacent to the first electrode layer and spaced from the substrate, the first surface substantially parallel to the substrate.

According to various embodiments of the present invention, the organic active layer comprises:

an electron transport layer adjacent to the second electrode layer, a hole transport layer adjacent to the first electrode layer, and an emissive layer between the electron transport layer and the hole transport layer, and a hole injection layer between the hole transport layer and the first electrode layer.

According to various embodiments of the present invention, the organic light-emitting diode structure further comprises one or more spacers disposed over the second insulating layer.

According to various embodiments of the present invention, the switching structure comprises:

a semiconductor layer disposed on part of the substrate for forming a channel layer;

a third insulating layer disposed on the substrate and the semiconductor layer, the third insulating layer entirely covering the semiconductor layer;

a first metal layer disposed on one part of the third insulating layer for forming the gate terminal above the channel layer;

a fourth insulating layer disposed over the first metal layer and another part of the third insulating layer, wherein a first opening made through the fourth insulating layer and the third insulating layer for providing a first exposed part of the channel layer, and that a second opening made through the fourth insulating layer and the third insulating layer for providing a second exposed part of the channel layer; and a second metal layer disposed on a first part of the fourth insulating layer for forming the drain terminal and a second part of the fourth insulating layer for forming the source terminal, the drain terminal in electrical contact with the first exposed part of the channel layer through the first opening, and the source terminal in electrical contact with the second exposed part of the channel layer through the second opening.

The third aspect of the present invention is a display panel. The display panel comprises:

a substrate; and a plurality of organic light-emitting diode structures disposed on the substrate, wherein each of the organic light-emitting diode structure comprises:

a switching structure on a substrate, the switching structure comprising a thin-film transistor comprising a source terminal, a gate terminal and a drain terminal;

a first insulating layer disposed on the switching structure, the first insulating layer entirely covering the thin-film transistor;

a first electrode layer disposed on one part of the first insulating layer;

a second insulating layer disposed on the first electrode layer and a different part of the first insulating layer, wherein a first opening made through the second insulating layer for providing an exposed part of the first electrode layer, and that a second opening made through the first insulating layer and the second insulating layer for providing an exposed part of the drain terminal;

an organic active layer disposed over the exposed part of the first electrode layer through the first opening;

a second electrode layer disposed over the second insulating layer and the organic active layer such that one part of the second electrode layer is in electrical contact with the organic active layer, and that a different part of the second electrode layer is in contact with the exposed part of the drain terminal through the second opening; and one or more spacers disposed over the second insulating layer, wherein the organic active layer comprises:

an electron transport layer adjacent to the second electrode layer, a hole transport layer adjacent to the first electrode layer, an emissive layer between the electron transport layer and the hole transport layer, and a hole injection layer between the hole transport layer and the first electrode layer.

According to one embodiment of the present invention, the switching structure comprises:

a first metal layer disposed on part of the substrate for forming the gate terminal;

a third insulating layer disposed on the substrate and the first metal layer, the third insulating layer entirely covering the first metal layer;

a semiconductor layer disposed over one part of the third insulating layer above the first metal layer for forming a channel layer;

a second metal layer disposed over a different part of the third insulating layer for separately forming the drain terminal and the source terminal above the first metal layer, the drain terminal and the source terminal separately in electrical contact with the channel layer; and a protective layer between part of the drain terminal and the channel layer and between part of the source terminal and the channel layer.

According to various embodiments of the present invention, the first insulating layer having a first surface adjacent to the first electrode layer and spaced from the substrate, the first surface substantially parallel to the substrate.

According to one embodiment of the present invention, the switching structure comprises:

a semiconductor layer disposed on part of the substrate for forming a channel layer;

a third insulating layer disposed on the substrate and the semiconductor layer, the third insulating layer entirely covering the semiconductor layer;

a first metal layer disposed on one part of the third insulating layer for forming the gate terminal above the channel layer;

a fourth insulating layer disposed over the first metal layer and another part of the third insulating layer, wherein a first opening made through the fourth insulating layer and the third insulating layer for providing a first exposed part of the channel layer, and that a second opening made through the fourth insulating layer and the third insulating layer for providing a second exposed part of the channel layer; and a second metal layer disposed on a first part of the fourth insulating layer for forming the drain terminal and a second part of the fourth insulating layer for forming the source terminal, the drain terminal in electrical contact with the first exposed part of the channel layer through the first opening, and the source terminal in electrical contact with the second exposed part of the channel layer through the second opening.

The present invention will become apparent upon reading the description taken in conjunction with FIGS. 5a to 6n.

BRIEF DESCRIPTION OF THE DRAWINGS

FIG. 2a shows a typical circuit in a pixel having an organic light-emitting diode of FIG. 1a.

DETAILED DESCRIPTION OF THE INVENTION

Figure 5A:
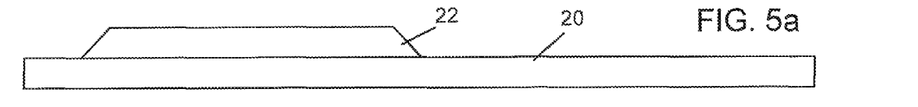
FIGS. 5a-5k show the process of fabricating an organic light-emitting diode with a n-type TFT, according to one embodiment of the present invention.
Figure 5B:
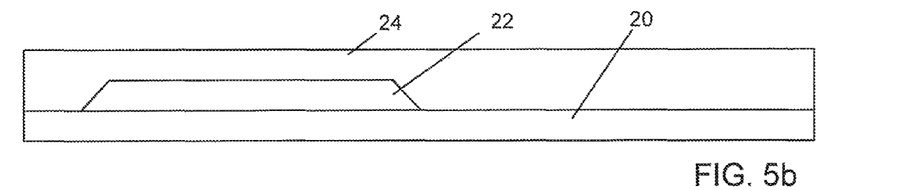
Figure 5C:
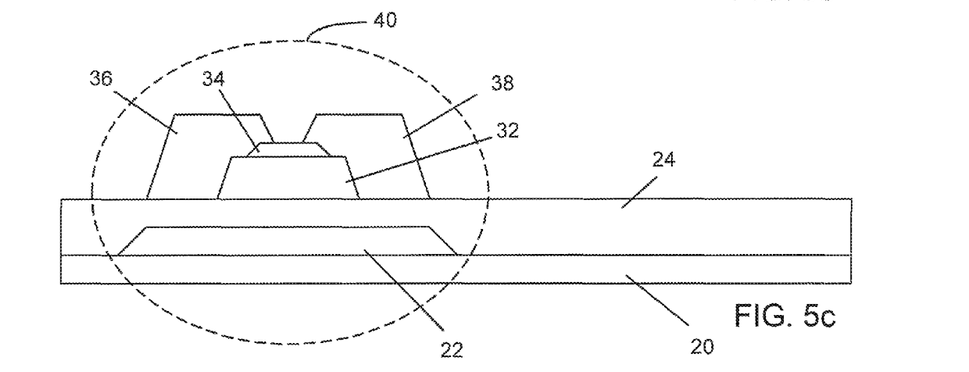
Figure 5D:
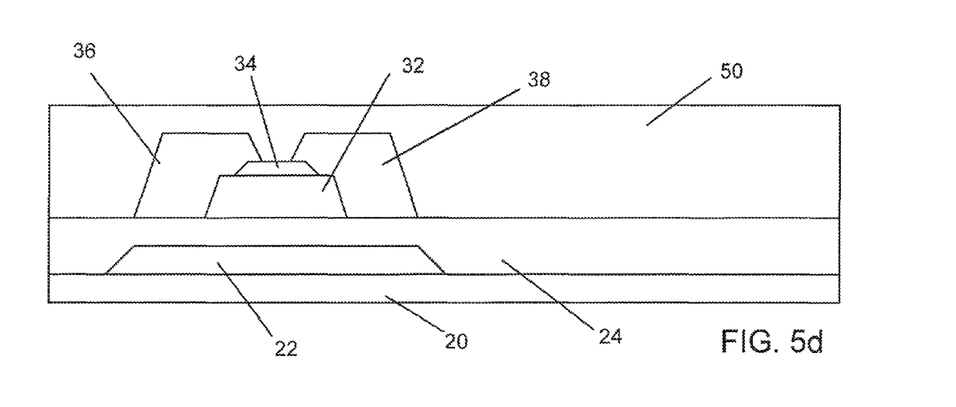

The present invention provides a process of fabricating a pixel element as depicted in the pixel circuit of FIG. 2b. As depicted in FIG. 2b, the cathode of the OLED is connected to the drain terminal D of an n-type transistor. As illustrated in FIGS. 5c, the n-type thin-film transistor 40 comprises a gate terminal 22, a drain terminal 36 and a source terminal 38. The transistor 40 further comprises a channel layer 32 and a protective layer 34. As shown in FIGS. 5i and 5k, the organic light-emitting diode 60 comprises an anode layer 62, a cathode layer 66, and an organic active layer 64 disposed between the anode layer 62 and the cathode layer 66. The cathode layer 66 is in electrical contact with the drain terminal 36 of the thin-film transistor 40. The organic active layer 64 can be similar to the OLED layer as depicted in FIG. 1a. The organic active layer 64 may comprise a hole-injecting layer (HIL) disposed over the anode layer, a hole-transport layer (HTL) disposed over the HIL layer, an emissive layer (EML) over the HTL layer, and an electron transport layer (ETL) disposed between the EML and the cathode layer.

One of the advantages of the pixel circuit as shown in FIG. 2b over the pixel circuit as shown in FIG. 2a is that the pixel circuit as shown in FIG. 2b can minimize or eliminate an image display defect known as image sticking. The present invention provides a pixel structure according to the pixel circuit as shown in FIG. 2b.

The present invention provides a pixel circuit fabricated on a substrate 20, which can be a rigid substrate, such as a glass substrate, or a flexible substrate, for example. According to one embodiment of the present invention, a first metal layer 22 is disposed on part of the substrate 20 for forming the gate terminal of a thin-film transistor 40 (see FIGS. 5a to 5c). An insulating layer 24 is disposed on the substrate 20 and the first metal layer 22 (see FIG. 5b). An n-type semiconductor layer 32 is disposed over part of the insulating layer 24 above the first metal layer 22 for forming a channel layer of the thin-film transistor 40. The semiconductor layer 32 can be made of an oxide-based semiconductor, a silicon-based semiconductor or an organic-based semiconductor, for example. The oxide-based semiconductor may contain one or more of the oxides of Zn, In, Ga, Sn, Ge, etc. The silicon-based semiconductor can be a crystallized semiconductor or an amorphous semiconductor, for example. A protective layer 34 is disposed on part of the channel layer 32. A second metal layer is provided on part of the insulating layer 24, the channel layer 32 and the protector layer 34 to separately form the drain terminal 36 and the source terminal 38 of the thin-film transistor 40 (see FIG. 5c). As shown in FIG. 5d, a planarization layer 50 is disposed on the insulating layer 24 and the thin-film transistor 40, covering the transistor entirely to provide a planar surface substantially parallel to the upper surface of the substrate 20. The planarization layer 50 can be made of organic material, organic-inorganic composite material, SiOx, SiNx, SiON, TiOx and AlOx.

Figure 5E:
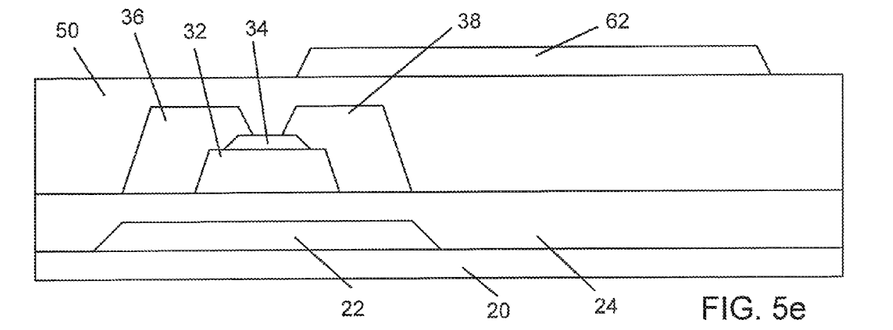
Figure 5F:
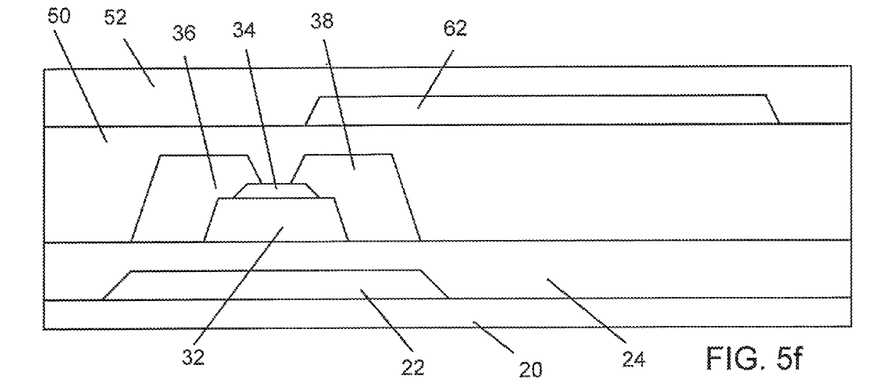
Figure 5G:
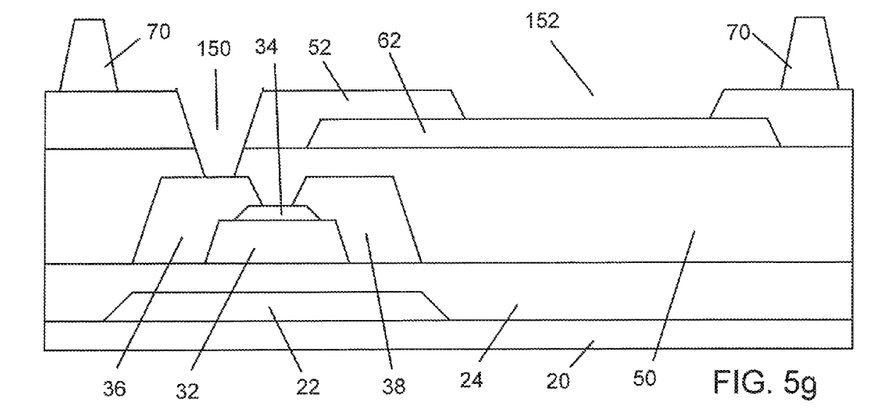
Figure 5H:
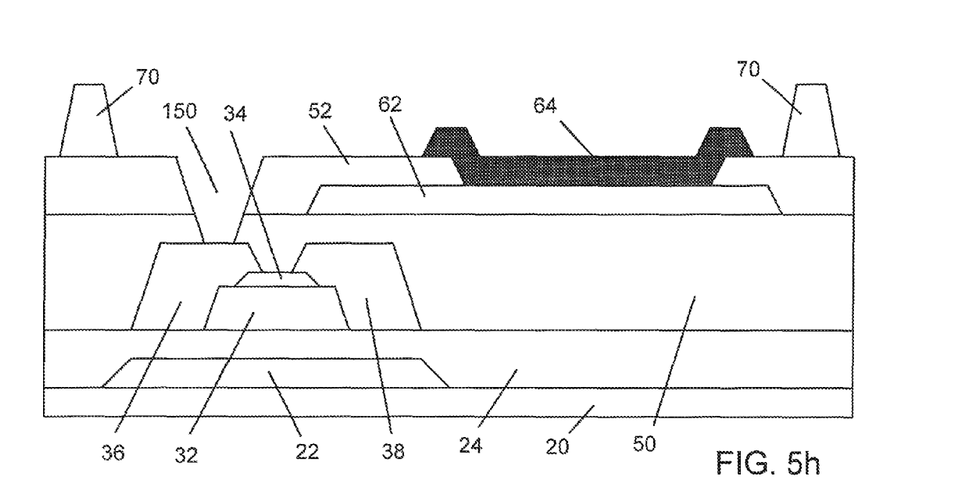
Figure 5I:
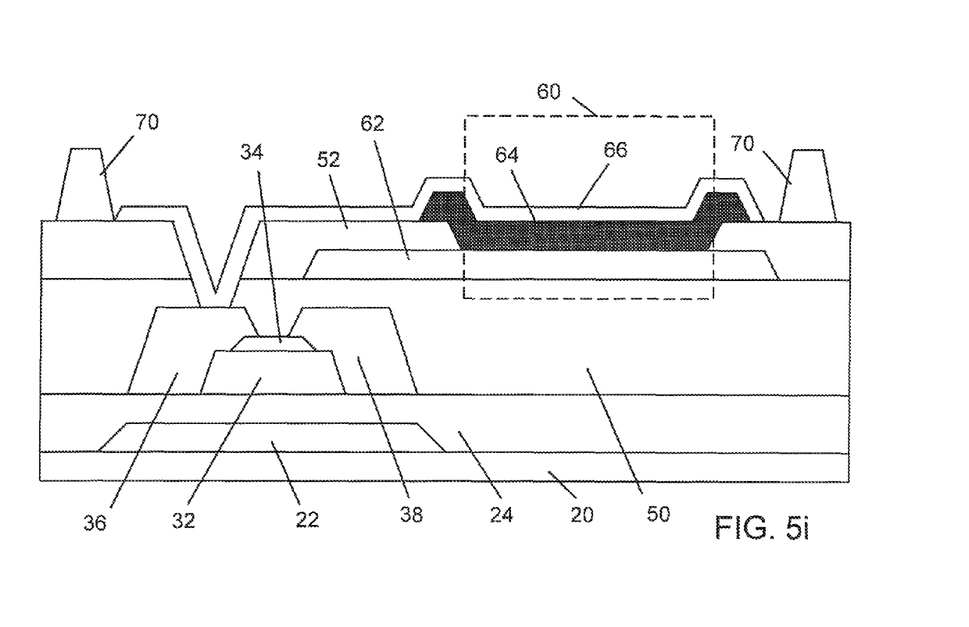

As shown in FIGS. 5e and 5f, a conductive layer is disposed on part of the planarization layer 50 to form the anode layer 62 of the light-emitting diode 60 (see FIG. 5i), and another insulating layer 52 is disposed on top of the anode layer 62 and the remaining part of the planarization layer 50. The conductive layer (the anode layer 62) can be made of ITO, Ag, Al, IZO or the combination thereof. As shown in FIG. 5g, an first opening 152 is made though the insulating layer 52, exposing part of the anode layer 62 to define the effective light emitting area of the light-emitting diode 60. A second opening 150 is made through both the insulating layer 52 and the planarization layer 50, exposing part of the drain terminal 36. Two or more spacers 70 are disposed on top of the insulating layer 52 so as to protect the pixel structure from being damaged by an upper substrate (not shown). An organic active layer 64 is disposed on the exposed part of the anode layer 62, as shown in FIG. 5h. To complete the pixel structure, an electrically conducting layer 66 is disposed on top of the organic active layer 64 to serve as the cathode layer of the light-emitting diode 60 and an electrical connector from the light-emitting diode 60 to the drain terminal 36 of the thin-film transistor 40 as shown in FIG. 5i.

Figure 5J:
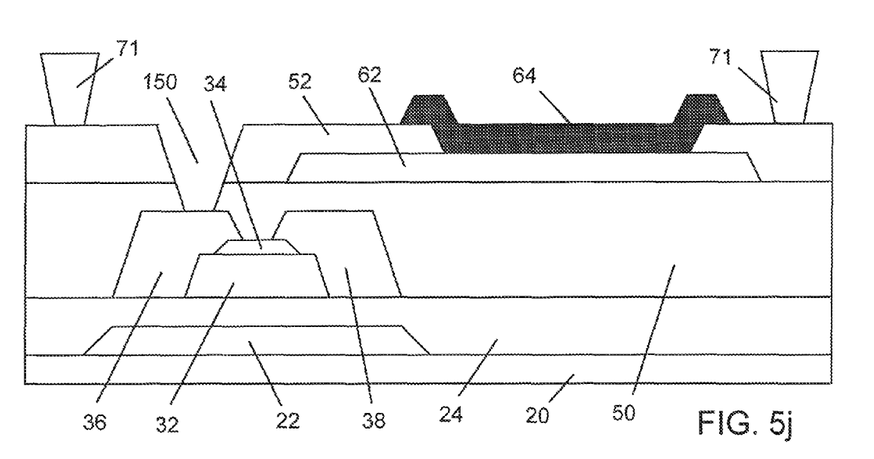
Figure 5K:
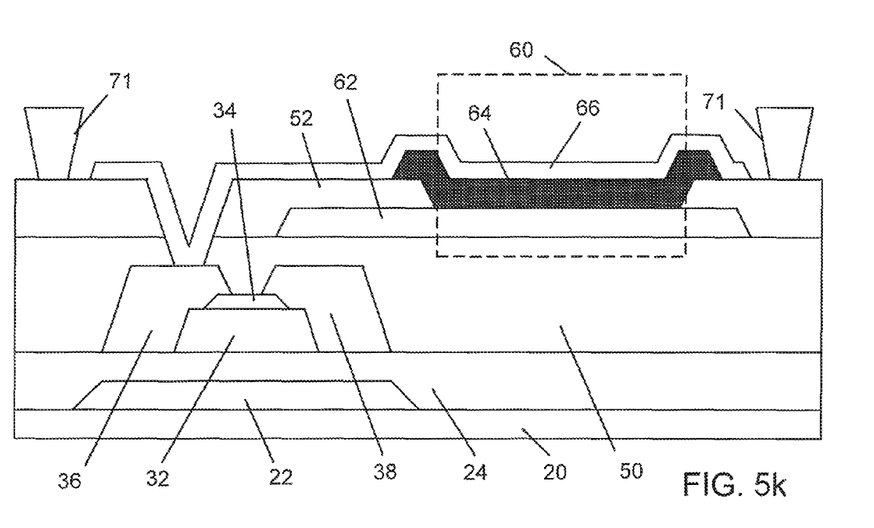

It should be noted that, with the shape of the spacers 70 having a wider bottom, a deposition mask is usually used to deposit the conducting layer 66 such that the conducting layer 66 will not be disposed on the spacers 70 so as to avoid a possible electrical contact between the conducting layer 66 and adjacent pixels. Alternatively, the conductive layer 66 is formed by depositing an electrically conductive layer over the insulating layer 52, the organic active layer 64 and the spacers 70, and patterning the electrically conductive layer into a desired shape. According to another embodiment of the present invention, the shape of the spacers can have a wider top as shown in FIGS. 5j and 5k. With the shape of the spacers 71 as shown in FIGS. 5j and 5k, it is possible to use a vacuum deposition method to dispose the conducting layer 66. Because the spacers 71 have a narrower bottom than the top, the conducting layer 66 will not form a continuous path between adjacent pixels even if the top part of the spacers 71 is coated with a conducting layer when the conducting layer is deposited. Alternatively, the conducting layer 66 can be deposited through a fine metal mask (FMM), or printed using an inkjet printing (IJP) method, or made by a laser-induced thermal imaging (LITI).

Figure 6A:
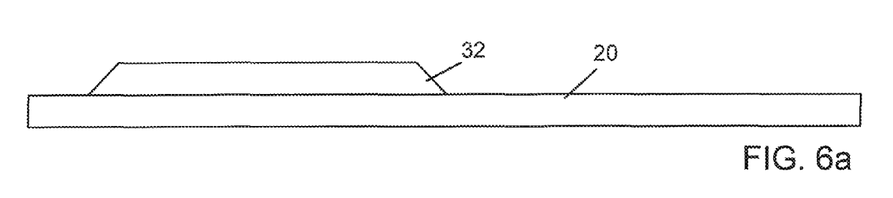
FIGS. 6a-6n show the process of fabricating an organic light-emitting diode with a n-type TFT, according to another embodiment of the present invention.
Figure 6B:
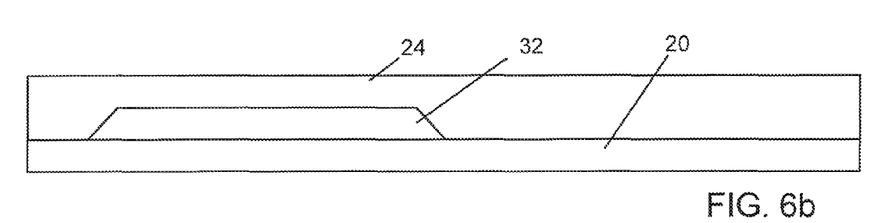
Figure 6C:
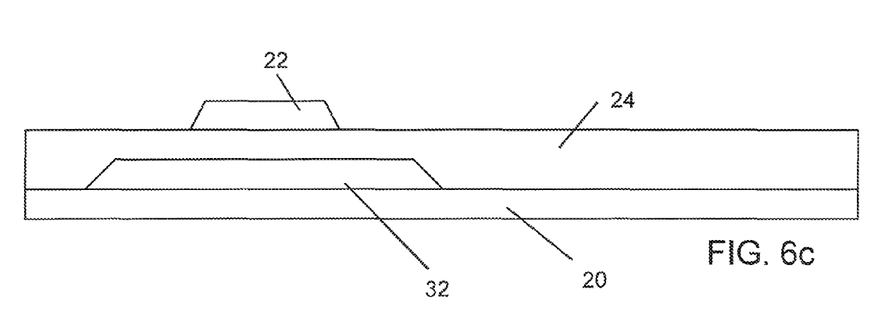
Figure 6D:
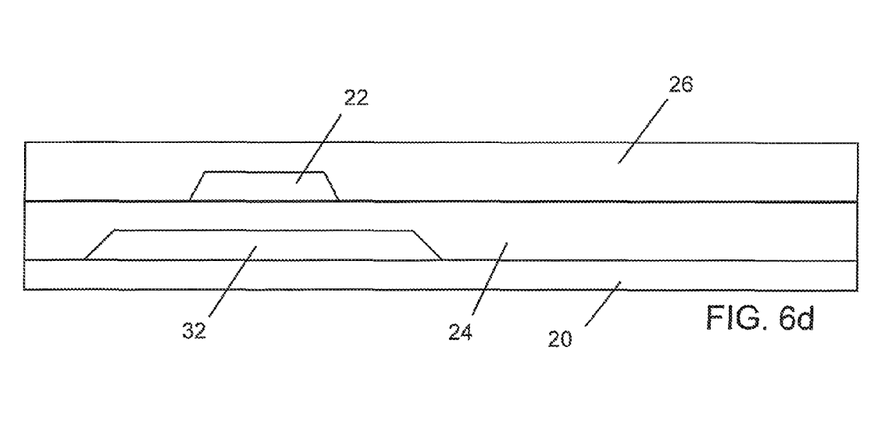
Figure 6E:
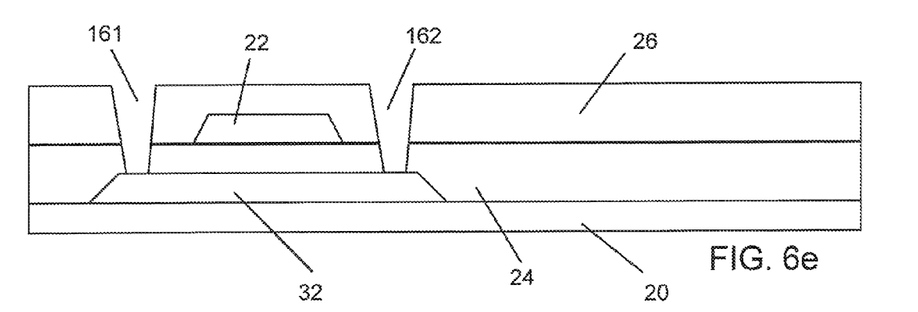
Figure 6F:
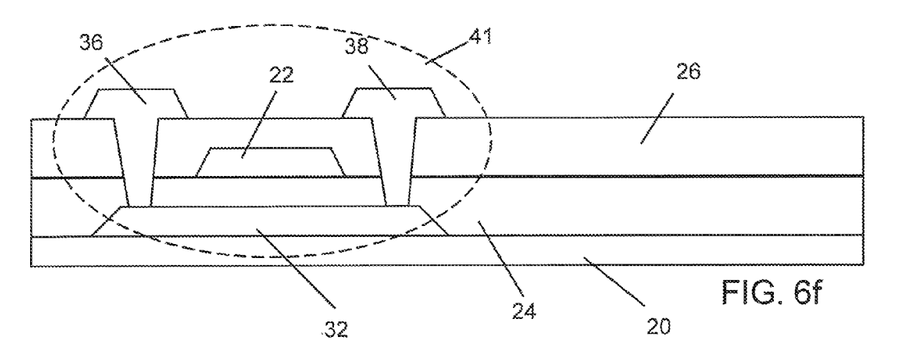
Figure 6G:
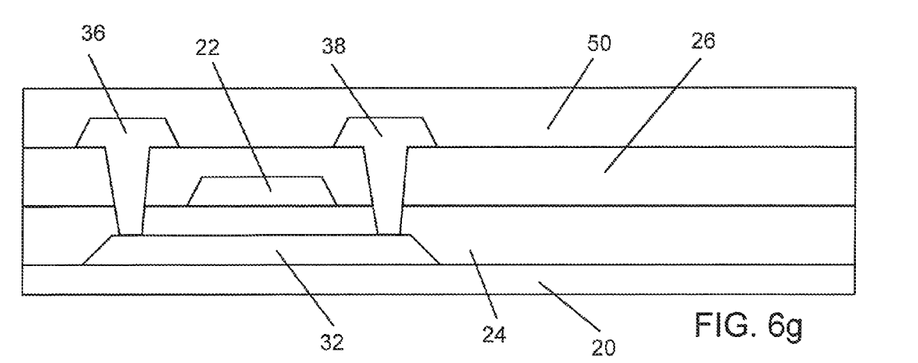

In a different embodiment of the present invention, the first layer disposed on the substrate 20 is an n-type semiconductor layer 32 for forming the channel layer of the thin-film transistor, as shown in FIG. 6a. A first insulating layer 24 is then disposed on the substrate 20 to cover the channel layer 32 (see FIG. 6b). A first metal layer 22 is disposed on part of the insulating layer 24 to form the gate terminal of the thin-film transistor, as shown in FIG. 6c. A second insulating layer 26 is disposed on the first insulating layer 24 to cover the first metal layer 22 as shown in FIG. 6d. As shown in FIG. 6e, a first opening 161 is made through both the first insulating layer 24 and the second insulating layer 26 to provide a first exposed part of the channel layer 32, and a second opening 162 is made through both the first insulating layer 24 and the second insulating layer 26 to provide a second exposed part of the channel layer 32. As shown in FIG. 6f, a second metal layer is disposed on the first exposed part of the channel layer 32 through the first opening 161 to form the drain terminal 36 of the thin-film transistor 41 and on the second exposed part of the channel layer 32 through the second opening 162 to form the source terminal 38 of the thin-film transistor 41. A planarization layer 50 is disposed on the second insulating layer 26 and the thin-film transistor 41, covering the transistor entirely, as shown in FIG. 6g.

Figure 6H:
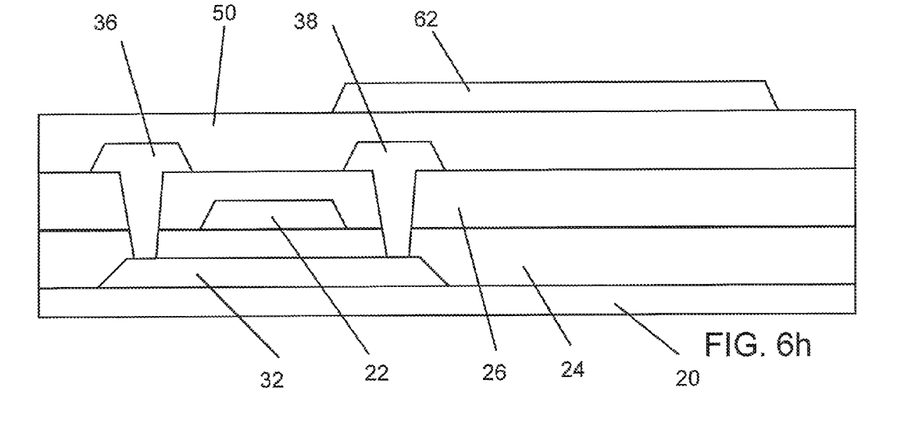
Figure 6I:
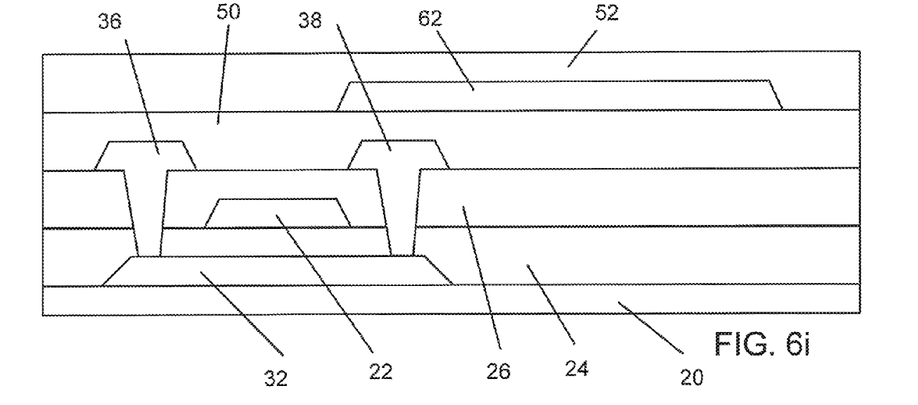
Figure 6J:
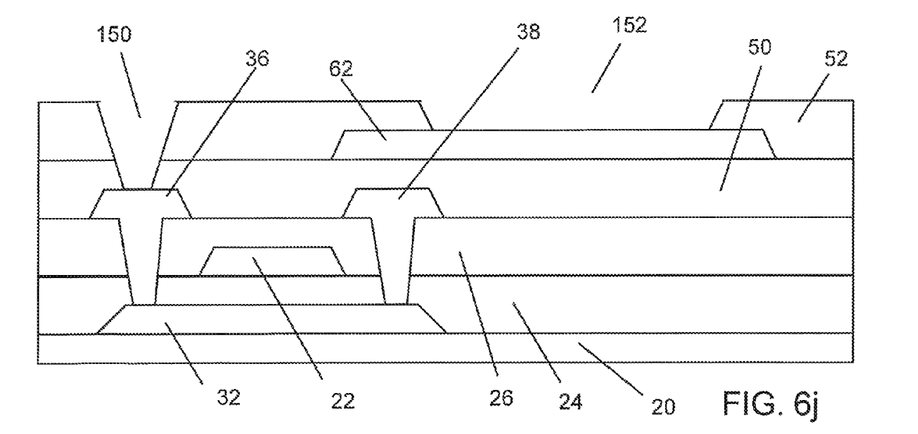
Figure 6K:
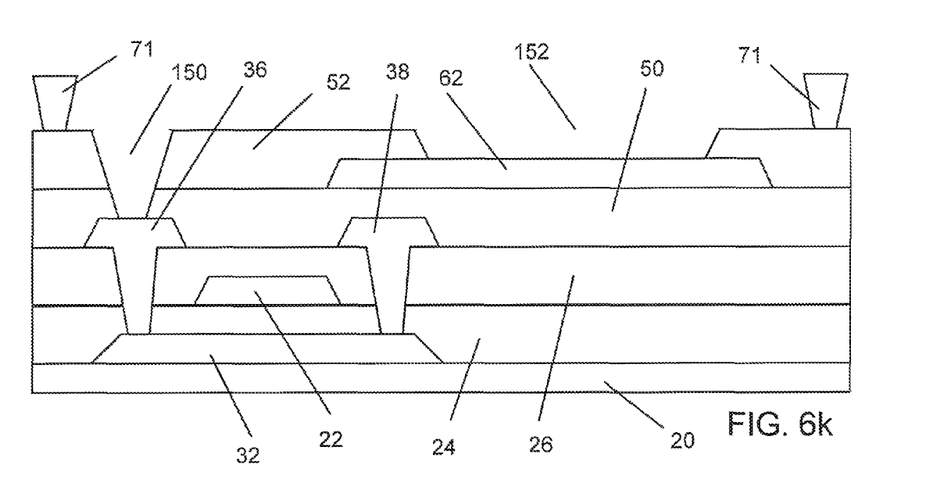
Figure 6L:
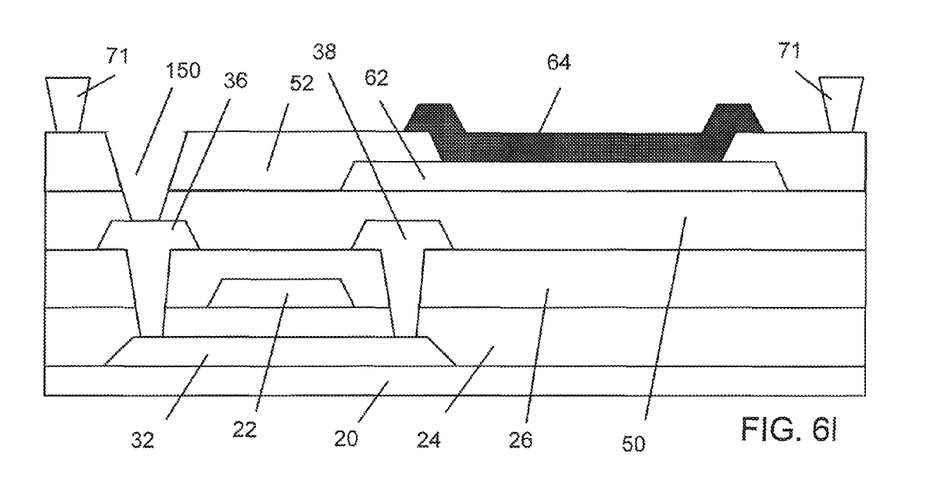
Figure 6M:
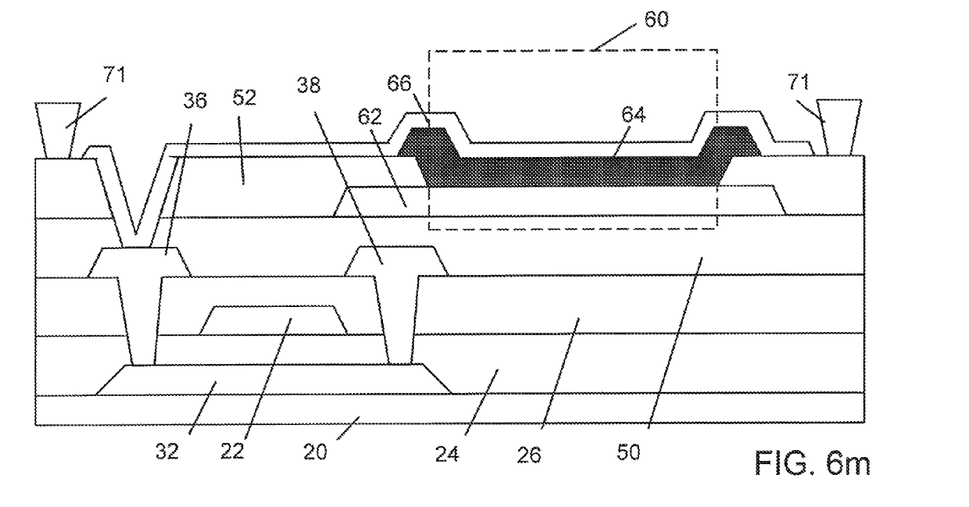
Figure 6N:
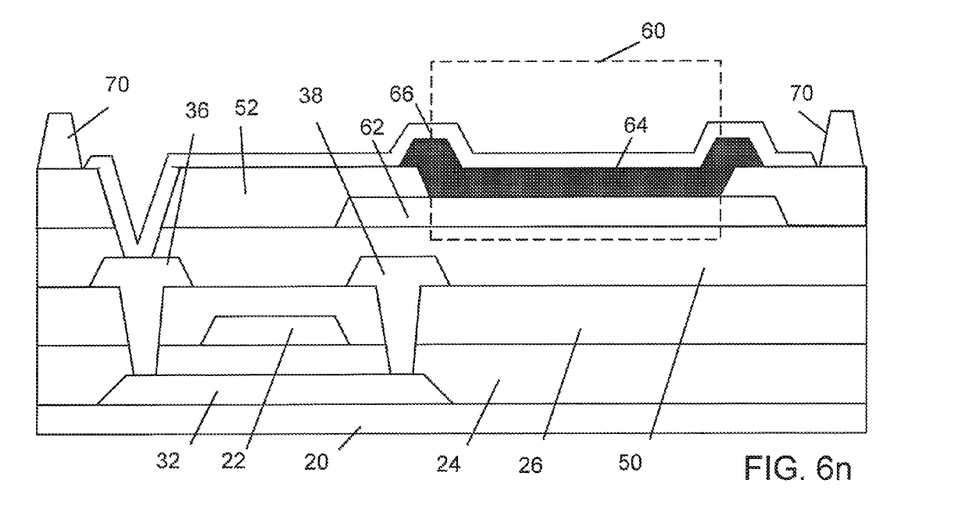

As shown in FIGS. 6h and 6i, a conductive layer is disposed on part of the planarization layer 50 to form the anode layer 62 of the light-emitting diode 60 (see FIGS. 6m and 6n), and a third insulating layer 52 is disposed on top of the anode layer 62 and the remaining part of the planarization layer 50. As shown in FIG. 6j, an first opening 152 is made though the third insulating layer 52, exposing part of the anode layer 62 to define the effective light emitting area of the light-emitting diode 60. A second opening 150 is made through both the third insulating layer 52 and the planarization layer 50, exposing part of the drain terminal 36. Two or more spacers 71 having a wider top are disposed on top of the third insulating layer 52 (see FIG. 6k) so as to protect the pixel structure from being damaged by an upper substrate (not shown). An organic active layer 64 is disposed on the exposed part of the anode layer 62, as shown in FIG. 6l. To complete the pixel structure, an electrically conducting layer 66 is disposed on top of the organic active layer 64 to serve as the cathode layer of the light-emitting diode 60 and an electrical connector from the light-emitting diode 60 to the drain terminal 36 of the thin-film transistor 41 as shown in FIG. 6m. Alternatively, one or more spacers 70 having a wider bottom are disposed on top of the insulating layer 52 as shown in FIG. 6n.

It should be noted that the spacers 70, 71 can be made of a photo-resist material deposited on the third insulating layer 52. The spacer 70 can be made of a positive type photo-resist material, and the spacer 71 can be made of a negative type photo-resist material, for example. Furthermore, the organic active layer 64 and the electrically conducting layer 66 can be made by several methods. For example, the organic active layer 64 and the conductive layer 66 can be deposited through a fine metal mask (FMM) in a shadow-mask method, or printed using an inkjet printing (IJP) method. They can also be realized by a laser-based method known as laser-induced thermal imaging (LITI). The protective layer 34 (FIG. 5c), the insulating layer 26 (FIG. 6d), and the insulating layer 50 (FIGS. 5f and 6i) can be made of any one of organic material, organic-inorganic composite material, SiOx, SiNx, SiON, TiOx and AlOx. The drain terminal 36 and the source terminal 38 (FIG. 5c) can be made by etching after the second metal layer is deposited on the insulating layer 24. In order to protect the channel layer (n-type semiconductor layer) 32 from being excessively etched, the protective layer 34 is provided on part of the channel layer 32 as shown in FIG. 5c.

In summary, the present invention provides a stratified organic light-emitting diode structure in which all the layers in the organic light-emitting diode (OLED) are substantially parallel to each other. The OLED is fabricated on a planarization layer that has a top surface substantially parallel to the substrate. As such, the major part of each of OLED layers can be made to have a uniform thickness and the OLED would produce a uniform brightness. Furthermore, since the top insulating layer of the OLED structure is also planar, spacers with uniform height can be fabricated on the top insulating layer to protect the pixel structure from being damaged by the upper substrate. As the OLED structure is part of an active-matrix OLED display, each OLED structure has a switching element, such as a thin-film transistor (TFT) to turn the OLED on and off. According to various embodiments of the present invention, the planarization layer covers the switching element entirely. Moreover, part of the planarization layer is covered by the top insulating layer. The anode of the OLED is disposed on the planarization layer without electrically connecting to the TFT. As such, in order to electrically connect the post-formed cathode electrode of the OLED to the drain terminal of the thin-film transistor, an opening is made through both the top insulating layer and the planarization layer to expose part of the drain terminal. The cathode of the OLED is electrically connected to the drain terminal of the TFT through the opening. Hence, the OLED structure of the present invention is fabricated as a normal-type OLED while it is operated as an inverted OLED.

The OLED structure further comprises one or more spacers disposed over the second insulating layer. The spacers can be various shapes. For example, the top of the spacer can be wider or narrower than the bottom of the spacer, but the top can have the same width as the bottom.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A method for fabricating an organic light-emitting diode structure on a substrate, comprising: providing a switching structure on the substrate, wherein the switching structure comprises a thin-film transistor comprising a source terminal, a gate terminal and a drain terminal; disposing a first insulating layer on the switching structure; disposing a first electrode layer on one part of the first insulating layer; disposing a second insulating layer on the first electrode layer and a different part of the first insulating layer; forming a first opening through the second insulating layer for providing an exposed part of the first electrode layer and a second opening through the first insulating layer and the second insulating layer for providing an exposed part of the drain terminal; disposing an organic active layer over the exposed part of the first electrode layer through the first opening; disposing a second electrode layer over: the second insulating layer and the organic active layer such that one part of the second electrode layer is in electrical contact with the organic active layer to form a tight-emitting diode together with the first electrode layer, and that a different part of the second electrode layer is in electrical contact with the exposed part of the drain terminal through the second opening; and disposing one or more spacers over and in contact with the second insulating layer.

2. The method according to claim 1, wherein said one or more spacers comprises a wider bottom.

3. The method according to claim 1, wherein said one or more spacers comprise a wider top.

4. The method according to claim 2, wherein the step of disposing the second electrode layer comprises:
   forming a conductive layer over said one or more spacers, the second insulating layer and the organic layer; and
   patterning the conductive layer to form the second electrode layer over the second insulating layer and the organic active layer.

5. The method according to claim 3, wherein the step of disposing the second electrode layer comprises:
   depositing a conductive layer over said one or more spacers, the second insulating layer the organic layer so as to form the second electronic layer.

6. The method according to claim 1, wherein the organic active layer comprises:
   an electron transport layer adjacent to the second electrode layer, a hole transport layer adjacent to the first electrode layer and an emissive layer between the electron transport layer and the hole transport layer.

7. The method according to claim 6, wherein the organic active layer further comprises a hole injection layer between the hole transport layer and the first electrode layer.

8. An organic light-emitting diode structure, comprising: a switching structure on a substrate, the switching structure comprising a thin-film transistor comprising a source terminal, a gate terminal and a drain terminal; a first insulating layer disposed on the switching structure; a first electrode: layer disposed on one part of the first insulating layer; a second insulating layer disposed on the first electrode layer and a different part of the first insulating layer, wherein a first opening made through the second insulating layer for providing an exposed part of the first electrode layer, and that a second opening made through the first insulating layer and the second insulating layer for providing an exposed part of the drain terminal; an organic active layer disposed over the exposed part of the first electrode layer through the first opening; and a second electrode layer disposed over the second insulating layer and the organic active layer such that one part of the second electrode layer is in electrical contact with the organic active layer, and that a different part of the second electrode layer is in electrical contact with the exposed part of the drain terminal through the second opening; and one or more spacers disposed over and in contact with the second insulating layer.

9. The organic light-emitting diode structure according to claim 8, wherein the switching structure comprises:
   a first metal layer disposed on part of the substrate for forming the gate terminal;
   a third insulating layer disposed on the substrate and the first metal layer;
   a semiconductor layer disposed over one part of the third insulating layer above the first metal layer for forming a channel layer; and
   a second metal layer disposed over a different part of the third insulating layer for separately forming the drain terminal and the source terminal above the first metal layer, the drain terminal and the source terminal separately in electrical contact with the channel layer.

10. The organic light-emitting diode structure according to claim 9, wherein the switching structure further comprises:
    a protective layer between part of the drain terminal and the channel layer and between part of the source terminal and the channel layer.

11. The organic light-emitting diode structure according to claim 8, wherein the organic active layer comprises:
    an electron transport layer adjacent to the second electrode layer, a hole transport layer adjacent to the first electrode layer and an emissive layer between the electron transport layer and the hole transport layer.

12. The organic light-emitting diode structure according to claim 11, wherein the organic active layer further comprises a hole injection layer between the hole transport layer and the first electrode layer.

13. The organic light-emitting diode structure according to claim 8, wherein spacers have a wider top.

14. The organic light-emitting diode structure according to claim 8, wherein the spacers have a wider bottom.

15. The organic light-emitting diode structure according to claim 8, wherein the switching structure comprises:
    a semiconductor layer disposed on part of the substrate for forming a channel layer;
    a third insulating layer disposed on the substrate and the semiconductor layer;
    a first metal layer disposed on one part of the third insulating layer for forming the gate terminal above the channel layer;
    a fourth insulating layer disposed over the first metal layer and another part of the third insulating layer, wherein a first opening made through the fourth insulating layer and the third insulating layer for providing a first exposed part of the channel layer, and that a second opening made through the fourth insulating layer and the third insulating layer for providing a second exposed part of the channel layer; and
    a second metal layer disposed on a first part of the fourth insulating layer for forming the drain terminal and a second part of the fourth insulating layer for forming the source terminal, the drain terminal in electrical contact with the first exposed part of the channel layer through the first opening, and the source terminal in electrical contact with the second exposed part of the channel layer through the second opening.

16. A display panel comprising:
a substrate; and
a plurality of organic light-emitting diode structures disposed on the substrate, wherein each of the organic light-emitting diode structure comprises:
a switching structure on a substrate, the switching structure comprising a thin-film transistor comprising a source terminal, a gate terminal and a drain terminal;
a first insulating layer disposed on the switching structure;
a first electrode layer disposed on one part of the first insulating layer;
a second insulating layer disposed on the first electrode layer and a different part of the first insulating layer, wherein a first opening made through the second insulating layer for providing an exposed part of the first electrode layer, and that a second opening made through the first insulating layer and the second insulating layer for providing an exposed part of the drain terminal;
an organic active layer disposed over the exposed part of the first electrode layer through the first opening;
a second electrode layer disposed over the second insulating layer and the organic active layer such that one part of the second electrode layer is in electrical contact with the organic active layer, and that a different part of the second electrode layer is in electrical contact with the exposed part of the drain terminal through the second opening; and
one or more spacers disposed over and in contact with the second insulating layer, wherein the organic active layer comprises:
an electron transport layer adjacent to the second electrode layer,
a hole transport layer adjacent to the first electrode layer,
an emissive layer between the electron transport layer and the hole transport layer, and
a hole injection layer between the hole transport layer and the first electrode layer.

17. The display panel according to claim 16, wherein the switching structure comprises:
a first metal layer disposed on part of the substrate for forming the gate terminal;
a third insulating layer disposed on the substrate and the first metal layer;
a semiconductor layer disposed over one part of the third insulating layer above the first metal layer for forming a channel layer;
a second metal layer disposed over a different part of the third insulating layer for separately forming the drain terminal and the source terminal above the first metal layer, the drain terminal and the source terminal separately in electrical contact with the channel layer; and
a protective layer between part of the drain terminal and the channel layer and between part of the source terminal and the channel layer.

18. The display panel according to claim 16, wherein the switching structure comprises:
a semiconductor layer disposed on part of the substrate for forming a channel layer;
a third insulating layer disposed on the substrate and the semiconductor layer;
a first metal layer disposed on one part of the third insulating layer for forming the gate terminal above the channel layer;
a fourth insulating layer disposed over the first metal layer and another part of the third insulating layer, wherein a first opening made through the fourth insulating layer and the third insulating layer for providing a first exposed part of the channel layer, and that a second opening made through the fourth insulating layer and the third insulating layer for providing a second exposed part of the channel layer; and
a second metal layer disposed on a first part of the fourth insulating layer for forming the drain terminal and a second part of the fourth insulating layer for forming the source terminal, the drain terminal in electrical contact with the first exposed part of the channel layer through the first opening, and the source terminal in electrical contact with the second exposed part of the channel layer through the second opening.

19. The display panel according to claim 16, wherein each of the spacers has a top area and a bottom area which is wider or narrower than the top area.

* * * * *